(12) United States Patent
Oostveen

(10) Patent No.: US 11,389,760 B2
(45) Date of Patent: Jul. 19, 2022

(54) FILTER FOR A VENT OPENING OF A CONTAINER

(71) Applicant: QOS Group B.V., Maarssen (NL)

(72) Inventor: Elmar Oostveen, Nieuwersluis (NL)

(73) Assignee: QOS GROUP B.V., Maarssen (NL)

( * ) Notice: Subject to any disclaimer, the term of this patent is extended or adjusted under 35 U.S.C. 154(b) by 17 days.

(21) Appl. No.: 16/902,968

(22) Filed: Jun. 16, 2020

(65) Prior Publication Data

US 2020/0368662 A1 Nov. 26, 2020

(30) Foreign Application Priority Data

Apr. 16, 2019 (NL) ...................................... 2022953

(51) Int. Cl.
*B01D 46/00* (2022.01)
*B01D 46/10* (2006.01)
*H05K 7/20* (2006.01)

(52) U.S. Cl.
CPC ........ *B01D 46/103* (2013.01); *B01D 2275/20* (2013.01); *H05K 7/20181* (2013.01)

(58) Field of Classification Search
CPC .. B01D 46/0015; B01D 46/10; B01D 46/103; B01D 46/105; B01D 46/106; B01D 2201/60–607; B01D 2265/00–06; B01D 2259/4541; B65D 5/32; B65D 5/4295–5293; H05K 7/20181
USPC .... 55/385.1–385.8, 418–420, 483, 510, 511; 435/398–401
See application file for complete search history.

(56) References Cited

U.S. PATENT DOCUMENTS

| 2,603,308 | A | * | 7/1952 | McCall | .............. B60K 15/0406 96/138 |
| 3,745,594 | A | * | 7/1973 | Cosper | ...................... E03C 1/22 4/292 |

(Continued)

FOREIGN PATENT DOCUMENTS

| DE | 29623363 U1 | 7/1998 |
| DE | 202010005268 U1 | 7/2010 |

(Continued)

OTHER PUBLICATIONS

Dutch Search Report dated Sep. 18, 2019, for corresponding Dutch Patent Application No. 2022953, filed Apr. 16, 2019.

*Primary Examiner* — T. Bennett McKenzie
(74) *Attorney, Agent, or Firm* — Steven M. Koehler; Westman, Champlin & Koehler, P.A.

(57) ABSTRACT

A filter for a vent opening of a container comprises a filter element and a flange which surrounds the filter element. The filter element and the flange are integrated by means of an injection molding process, in which material is injected against a solid filter element in a mold, from which material the flange arises after curing. The filter element has an edge portion which extends in its circumferential direction. The edge portion has a front side, a back side and a side edge extending between the front side and the back side. The back side is covered by the flange and the side edge in circumferential direction of the edge portion is alternatingly entirely and partly covered from the back side by the material of the flange. At the locations where the side edge is entirely covered the front side is also covered by the material of the flange.

18 Claims, 2 Drawing Sheets

(56) References Cited

U.S. PATENT DOCUMENTS

| | | | | |
|---|---|---|---|---|
| 3,966,439 A * | 6/1976 | Vennos | ............... | G01N 1/2205 73/863.22 |
| 4,737,174 A * | 4/1988 | Pontius | ............... | B01D 46/12 55/491 |
| 4,938,749 A * | 7/1990 | Jensen | ............... | A61F 5/441 55/385.4 |
| 5,007,946 A * | 4/1991 | Babini | ............... | H05K 7/20181 55/501 |
| 5,080,001 A * | 1/1992 | Ishibashi | ............... | B29C 33/123 454/370 |
| 5,227,074 A * | 7/1993 | Nichols | ............... | A61L 2/26 210/767 |
| 5,725,645 A * | 3/1998 | Wickland | ............... | B65F 1/0006 96/17 |
| 6,056,439 A * | 5/2000 | Graham | ............... | B65D 77/225 220/89.1 |
| 6,447,565 B1 * | 9/2002 | Raszkowski | ............... | F16H 57/027 220/371 |
| 6,524,361 B1 * | 2/2003 | Thornton | ............... | B01D 19/0031 55/385.1 |
| 7,156,890 B1 * | 1/2007 | Thompson | ............... | B01D 46/0005 301/108.1 |
| 7,166,024 B2 * | 1/2007 | Mashiko | ............... | F21S 45/33 454/370 |
| 7,255,354 B2 * | 8/2007 | Tamura | ............... | B29C 45/14336 215/261 |
| 8,187,356 B2 * | 5/2012 | Probst | ............... | A62B 9/00 55/505 |
| 8,512,428 B2 * | 8/2013 | Ueki | ............... | B01D 39/1692 55/385.4 |
| 8,727,844 B2 * | 5/2014 | Furuyama | ............... | B29C 66/30223 454/284 |
| 8,734,573 B2 * | 5/2014 | Ono | ............... | H05K 5/0213 96/4 |
| 9,919,850 B2 * | 3/2018 | Bons | ............... | B65D 75/5877 |
| 2002/0066370 A1 * | 6/2002 | Goglio | ............... | B65D 81/267 96/134 |
| 2003/0126843 A1 * | 7/2003 | Hsu | ............... | B01D 46/0002 55/385.4 |
| 2004/0173556 A1 | 9/2004 | Smolko et al. | | |
| 2005/0091950 A1 * | 5/2005 | Weaver | ............... | B60T 11/26 55/385.4 |
| 2005/0263479 A1 | 12/2005 | Smolko et al. | | |
| 2005/0263480 A1 | 12/2005 | Smolko et al. | | |
| 2008/0295468 A1 * | 12/2008 | Ye | ............... | G06F 1/206 55/385.6 |
| 2009/0047890 A1 * | 2/2009 | Yano | ............... | F21V 31/03 454/143 |
| 2011/0016836 A1 * | 1/2011 | Yano | ............... | F21V 31/03 55/491 |
| 2011/0132198 A1 * | 6/2011 | Gallo | ............... | B01D 46/12 96/222 |
| 2012/0060693 A1 * | 3/2012 | Sasaki | ............... | B01D 46/543 96/139 |
| 2013/0055898 A1 * | 3/2013 | Yano | ............... | F21S 45/30 96/4 |
| 2015/0182898 A1 * | 7/2015 | Bansal | ............... | B01D 39/1661 55/521 |
| 2015/0306529 A1 * | 10/2015 | Yano | ............... | B01D 46/0002 96/7 |
| 2016/0056533 A1 * | 2/2016 | Nissinen | ............... | H02H 9/04 343/702 |
| 2016/0109419 A1 * | 4/2016 | Matsui | ............... | B01D 46/0002 73/23.2 |
| 2016/0174397 A1 * | 6/2016 | Ishii | ............... | H05K 5/0213 55/385.4 |
| 2020/0024067 A1 | 1/2020 | Aguilar Monforte | | |

FOREIGN PATENT DOCUMENTS

| | | |
|---|---|---|
| EP | 0816043 | 1/1998 |
| GB | 1271860 A | 4/1972 |
| WO | 2018178481 | 10/2018 |

* cited by examiner

FILTER FOR A VENT OPENING OF A CONTAINER

BACKGROUND

The discussion below is merely provided for general background information and is not intended to be used as an aid in determining the scope of the claimed subject matter.

The present invention is related to a filter for a vent opening of a container.

Products in the food industry are packaged in a protective atmosphere in order to extend preservability of products. For example, in case of packaging powder-shaped dairy products in a container the amount of oxygen in the container can be lowered by replacing it with nitrogen or a mixture of carbon dioxide and nitrogen. Air can be removed from the container by means of a vacuum technique after which the product can be flushed with an inert gas. The inert gas can be blown into the powder until the conditions in the container are atmospheric again. In order to remove air from the container without drawing out the stored product the container is provided with a filter that will be sealed after removing the air and introducing the inert gas through it.

SUMMARY

A filter is provided with a filter element and a flange which surrounds the filter element, wherein the filter element and the flange are integrated by means of an injection molding process, in which material is injected against a solid filter element in a mold, from which material the flange arises after curing, and wherein the filter element has an edge portion which extends in its circumferential direction, wherein the edge portion is provided with a front side, a back side and a side edge which extends between the front side and the back side, wherein the back side is covered by the material of the flange and wherein the side edge in circumferential direction of the edge portion is alternatingly entirely and partly covered from the back side by the material of the flange, wherein at the locations where the side edge is entirely covered the front side is also covered by the material of the flange.

An advantage of the filter is that in an injection molding mold the filter element can be positioned by holding fingers and held at the locations where the edge portion is only partly covered by the material of the flange. Furthermore, the alternating coverings of the front side of the edge portion appear to have an advantageous effect on the stability of the shape of the flange, since they minimize the tendency of warping.

The locations where the side edge is entirely covered may be located at equal distances from each other in circumferential direction of the edge portion.

The filter element may be made from a sintered polymer.

The filter element and the flange may be made from the same polymer, for example polyethylene. This has a positive effect on the adherence between the filter element and the flange.

The filter element may have a dome shape at the inner side of the edge portion.

In a particular embodiment the bulging of the dome shape is located at the front side of the edge portion, wherein the flange at the back side of the edge portion is provided with a wall extending transversely on the flange so as to form a tube for guiding a fluid through the filter element.

Preferably, the tube is provided with a screw thread at its outer side for releasably mounting a sealing cap thereon.

The coverings at the front side may form projections which project from the flange.

DETAILED DESCRIPTION OF THE ILLUSTRATIVE EMBODIMENT

FIGS. 1-4 show different views of an embodiment of a filter 1. The filter 1 comprises a filter element 2 which is surrounded by a flange 3. The filter 1 is made by means of a molding process. The filter element 2 is made from sintered polyethylene and placed, in the form of a prefabricated solid part, in an injection molding mold, after which liquid polyethylene for forming the surrounding flange 3, preferably as a single unitary body, is introduced into the injection molding mold so as to form the resulting filter 1.

The filter 1 can be mounted to a container (not shown), for example by welding the flange to a surrounding edge of an opening in the container. When the container is filled with a product having limited preservability, for example for the food industry, air can be removed from the container via the filter 1 whereas the product cannot be drawn out because of the presence of the filter 1.

Figure 2:
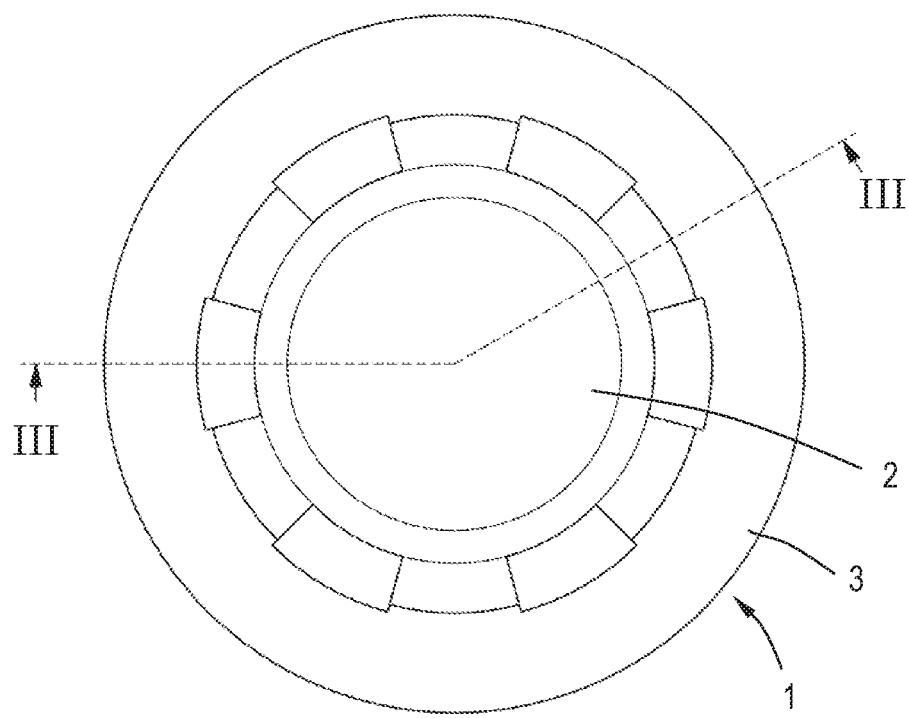
FIG. 2 is a plan view of the embodiment according to FIG. 1.
Figure 3:
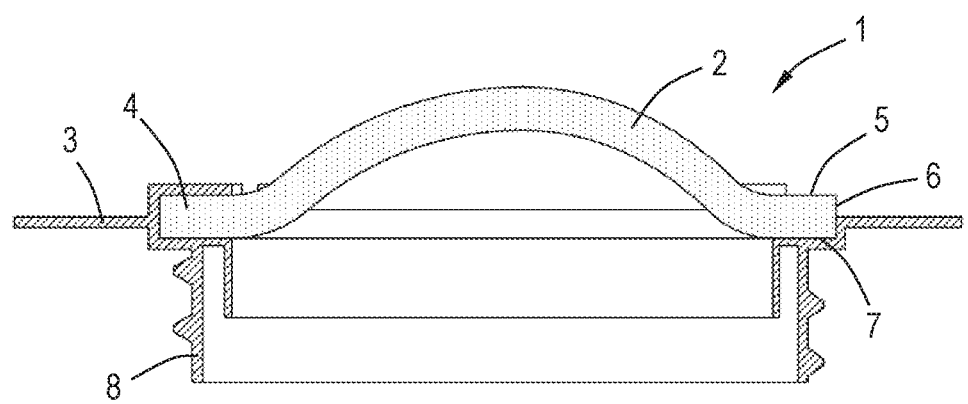
FIG. 3 is a sectional view along the line III-III in FIG. 1.

FIGS. 2 and 3 show that the filter element 2 has a ring-shaped edge portion 4 which extends in its circumferential direction. The filter element 2 has a dome shape at the inner side of the edge portion 4, but in an alternative embodiment it may have a different shape and may be flat, for example. The edge portion 4 has a front side 5, a side edge 6 and a back side 7. The side edge 6 extends between the front side 5 and the back side 7. The back side 7 of the edge portion 4 is entirely covered by the material of the flange 3, whereas the side edge 6 in circumferential direction of the edge portion 4 is alternatingly entirely and partly covered from the back side 7 by the material of the flange 3. At the locations where the side edge 6 is entirely covered the front side 5 of the edge portion 4 is also covered by the material of the flange 3.

Figure 1:
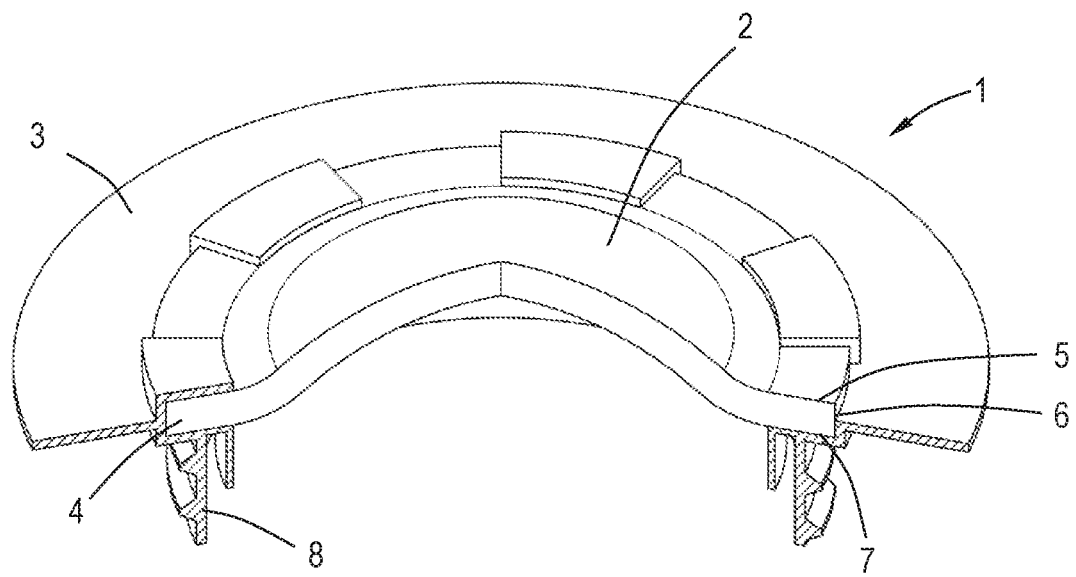
FIG. 1 is a perspective sectional view of an embodiment of a filter.

FIG. 1 shows that the locations where the side edge 6 is entirely covered are located at equal distances from each other in circumferential direction of the edge portion 4.

Figure 4:
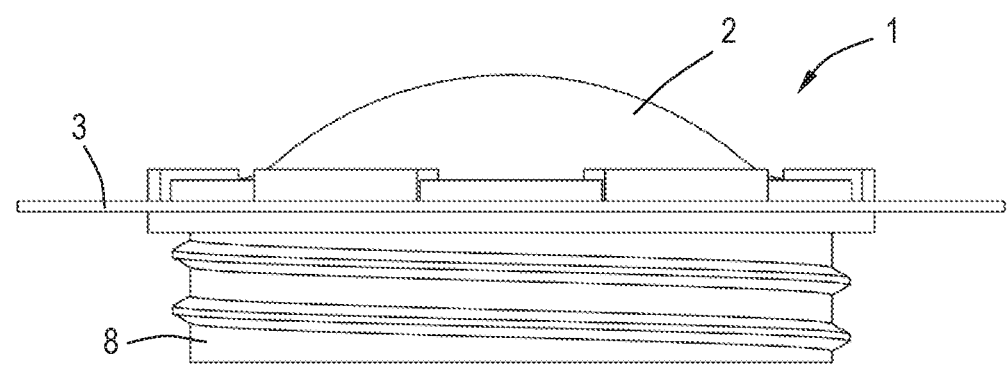
FIG. 4 is a side view of the embodiment according to FIG. 1.

FIGS. 1, 3 and 4 show that the bulging of the dome shape is located at the upper side 5 of the edge portion 4.

At the back side 7 of the edge portion 4 the flange 3 is provided with a tubular portion 8, which extends perpendicular to the plane of the flange 3. The outer side of the tubular portion 8 is provided with a screw thread on which a sealing cap (not shown) can be screwed. When the filter 1 is mounted on a container to be vented, the container can be sealed from the ambient air by means of the sealing cap after removal of the air and possible introduction of an inert gas into the container.

The filter element 2 and the flange 3 are made from the same basic material, for example polyethylene. Consequently, the outer side of the edge portion 4 of the filter element 2 is fused with the material of the flange 3 during the injection molding process.

The invention is not restricted to the embodiment shown in the drawings and described above, which can be varied in different ways within the scope of the invention.

What is claimed is:

1. A filter for a vent opening of a container, comprising a filter element and a flange which surrounds the filter element, wherein the filter element and the flange are integrated by via an injection molding process, in which material is injected against a solid filter element in a mold, from which material the flange is present after curing, and wherein the filter element has an edge portion which extends in a circumferential direction of the filter element, wherein the edge portion is provided with a front side, a back side and a side edge which extends between the front side and the back side, wherein the back side is covered by the material of the flange and wherein the side edge in a circumferential direction of the edge portion is alternatingly entirely and partly covered from the back side by the material of the flange, wherein at the locations where the side edge is entirely covered the front side is also covered by the material of the flange.

2. The filter according to claim 1, wherein the locations where the side edge is entirely covered are located at equal distances from each other in a circumferential direction of the edge portion.

3. The filter according to claim 1, wherein the filter element is made from a sintered polymer.

4. The filter according to claim 3, wherein the filter element and the flange are made from the same polymer.

5. The filter according to claim 4 wherein the polymer is polyethylene.

6. The filter according to claim 1, wherein the filter element has a dome shape at an inner side of the edge portion.

7. The filter according to claim 6, wherein a bulging portion of the dome shape is located at the front side of the edge portion and wherein the flange at the back side of the edge portion is provided with a wall extending transversely on the flange so as to form a tube configured to guide a fluid through the filter element.

8. The filter according to claim 7, wherein the tube is provided with a screw thread at its outer side configured to releasably mount a sealing cap thereon.

9. The filter according to claim 1, wherein the coverings at the front side form projections which project from the flange.

10. A method for making a filter for a vent opening of a container, the method comprising:

providing a solid filter element in a mold; and in an injection molding process, injecting material against the filter element so as to integrate the filter element with a flange that surrounds the filter element, wherein the filter element has an edge portion which extends in its circumferential direction, wherein the edge portion is provided with a front side, a back side and a side edge which extends between the front side and the back side, wherein the back side is covered by the material of the flange and wherein the side edge in a circumferential direction of the edge portion is alternatingly entirely and partly covered from the back side by the material of the flange, wherein at the locations where the side edge is entirely covered the front side is also covered by the material of the flange.

11. The method according to claim 10, wherein the locations where the side edge is entirely covered are located at equal distances from each other in a circumferential direction of the edge portion.

12. The method according to claim 10, wherein the filter element is made from a sintered polymer.

13. The method according to claim 12, wherein the filter element and the flange are made from the same polymer.

14. The method according to claim 13 wherein the polymer is polyethylene.

15. The method according to claim 10, wherein the filter element has a dome shape at an inner side of the edge portion.

16. The method according to claim 15, wherein a bulging portion of the dome shape is located at the front side of the edge portion and wherein the flange at the back side of the edge portion is provided with a wall extending transversely on the flange so as to form a tube configured to guide a fluid through the filter element.

17. The method according to claim 16, wherein the tube is provided with a screw thread at its outer side configured to releasably mount a sealing cap thereon.

18. The method according to claim 10, wherein the coverings at the front side form projections which project from the flange.

* * * * *